United States Patent
Honda et al.

(10) Patent No.: US 10,125,421 B2
(45) Date of Patent: Nov. 13, 2018

(54) PLASMA CVD APPARATUS, PLASMA CVD METHOD, AND AGITATING DEVICE

(75) Inventors: Yuuji Honda, Nagareyama (JP); Takayuki Abe, Toyama (JP)

(73) Assignee: ADVANCED MATERIAL TECHNOLOGIES, INC., Chiba (JP)

( * ) Notice: Subject to any disclaimer, the term of this patent is extended or adjusted under 35 U.S.C. 154(b) by 772 days.

(21) Appl. No.: 12/865,788

(22) PCT Filed: Feb. 6, 2008

(86) PCT No.: PCT/JP2008/052380
§ 371 (c)(1),
(2), (4) Date: Sep. 21, 2010

(87) PCT Pub. No.: WO2009/098784
PCT Pub. Date: Aug. 13, 2009

(65) Prior Publication Data
US 2011/0003088 A1 Jan. 6, 2011

(51) Int. Cl.
*C23C 16/50* (2006.01)
*C23C 16/44* (2006.01)
(Continued)

(52) U.S. Cl.
CPC ........... *C23C 16/4417* (2013.01); *B01J 2/006* (2013.01); *B01J 2/12* (2013.01); *C23C 16/26* (2013.01);
(Continued)

(58) Field of Classification Search
CPC ..... B01J 2/003; B01J 2/00; B01J 2/006; B01J 2/12; C23C 16/4417; C23C 16/272
See application file for complete search history.

(56) References Cited

U.S. PATENT DOCUMENTS 4,073,265 A * 2/1978 Walling ................ B05C 19/025
  118/309
5,006,192 A * 4/1991 Deguchi .................. 156/345.44
(Continued)

FOREIGN PATENT DOCUMENTS

JP  52-100657  8/1977
JP  61-082830  4/1986
(Continued)

OTHER PUBLICATIONS

English translation of JP2006-257472, Abe, Sep. 28, 2006.*
International Search Report dated May 27, 2008 in International (PCT) Application No. PCT/JP2008/052380.

*Primary Examiner* — Aiden Lee
(74) *Attorney, Agent, or Firm* — Wenderoth, Lind & Ponack, L.L.P.

(57) ABSTRACT

A plasma CVD apparatus efficiently coats the surfaces of fine particles with a thin film or super-fine particles by concentrating a plasma near the fine particles. The plasma CVD apparatus includes a chamber, a container disposed in the chamber for housing the fine particles, the container having a polygonal inner shape in a cross section substantially perpendicular to a longitudinal axis of the container, a ground shielding member for shielding a surface of the container other than a housing face, a rotation mechanism for causing the container to rotate or act as a pendulum on an axis of rotation substantially perpendicular to the cross section, an opposed electrode disposed in the container so as to face the housing face, a plasma power source electrically connected to the container, a gas introducing mechanism for introducing a raw gas into the container, and an evacuation mechanism for evacuating the chamber.

11 Claims, 9 Drawing Sheets

(51) Int. Cl.
    *B01J 2/00*           (2006.01)
    *B01J 2/12*           (2006.01)
    *C23C 16/26*         (2006.01)
    *C23C 16/442*        (2006.01)
    *H01J 37/32*         (2006.01)

(52) U.S. Cl.
    CPC ........ *C23C 16/442* (2013.01); *H01J 37/3266* (2013.01); *H01J 37/32568* (2013.01); *H01J 37/32633* (2013.01); *H01J 2237/20207* (2013.01); *H01J 2237/20214* (2013.01)

(56) References Cited

U.S. PATENT DOCUMENTS

| | | | |
|---|---|---|---|
| 5,389,197 A * | 2/1995 | Ishimaru | 216/67 |
| 5,581,874 A * | 12/1996 | Aoki et al. | 29/825 |
| 5,593,511 A * | 1/1997 | Foster et al. | 148/238 |
| 6,139,679 A * | 10/2000 | Satitpunwaycha | 156/345.37 |
| 6,353,201 B1 * | 3/2002 | Yamakoshi et al. | 219/121.52 |
| 6,553,932 B2 * | 4/2003 | Liu et al. | 118/723 E |
| 6,676,800 B1 * | 1/2004 | Festa | B08B 7/0035 134/1.1 |
| 2002/0051726 A1 * | 5/2002 | Nakamura et al. | 419/38 |
| 2005/0249871 A1 * | 11/2005 | Tokarski | B01J 2/006 427/212 |
| 2006/0037702 A1 * | 2/2006 | Hayashi et al. | 156/345.46 |
| 2008/0173401 A1 * | 7/2008 | Jeon | H01J 37/32532 156/345.33 |

FOREIGN PATENT DOCUMENTS

| | | |
|---|---|---|
| JP | 3-231756 | 10/1991 |
| JP | 6-287760 | 10/1994 |
| JP | 2003-13229 | 1/2003 |
| JP | 2003-247070 | 9/2003 |
| JP | 2006-16661 | 1/2006 |
| JP | 2006-257472 | 9/2006 |
| JP | 2006-261363 | 9/2006 |

\* cited by examiner

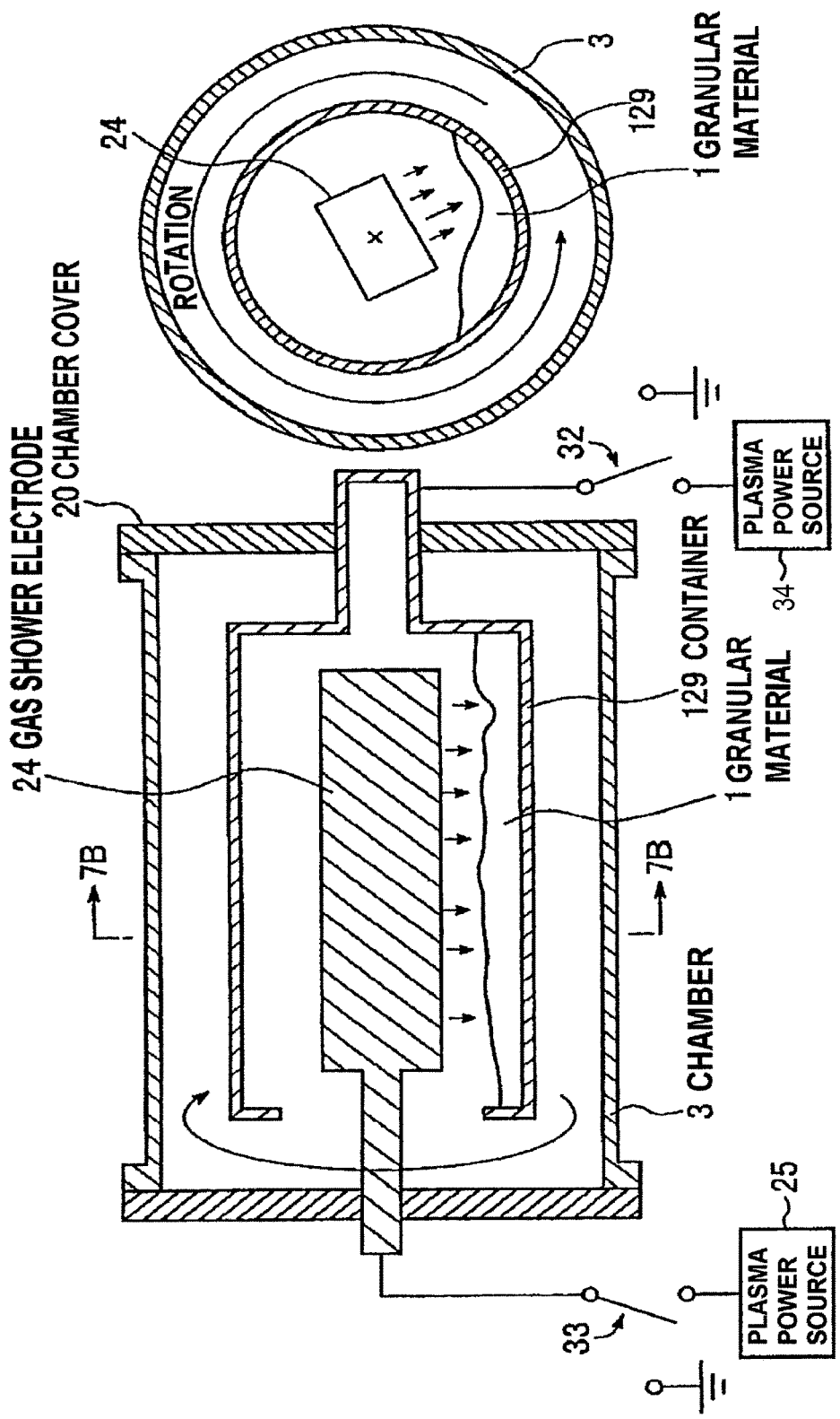

PLASMA CVD APPARATUS, PLASMA CVD METHOD, AND AGITATING DEVICE

BACKGROUND OF THE INVENTION

Technical Field

The present invention relates to a plasma CVD (Chemical Vapor Deposition) apparatus and a plasma CVD method capable of coating the surfaces of fine particles or electronic parts efficiently with a thin film or super-fine particles by concentrating a plasma near the fine particles. Moreover, the present invention relates to an agitating device for agitating fine particles or electronic parts having small diameters.

BACKGROUND ART

FIG. 9 (A) is a cross-sectional view showing the outline of a conventional plasma CVD apparatus, and FIG. 9 (B) is a cross-sectional view along the 7B-7B line shown in FIG. 9 (A).

The plasma CVD apparatus has a cylindrical chamber 3. Both ends of the chamber 3 are closed with chamber covers 20. Inside the chamber 3, a container 129 is disposed. A section of the container 129 is cylindrical as shown in FIG. 9 (B). Also, the container 129 is configured so as to house granular materials (fine particles) 1 constituting an object to be coated inside it. Moreover, the container 129 functions as an electrode to be connected to a plasma power source 34 or the ground potential, wherein both are constituted so as to be switchable by a switch 32. The section shown in FIG. 9 (B) is a section approximately parallel to the direction of the gravity.

The container 129 is provided with a rotation mechanism (not shown). By rotating the container 129 as the arrow by the rotation mechanism, the granular materials (fine particles) 1 in the container 129 are subjected to a coating treatment through the agitation or the rotation. The axis of rotation when the container 129 is rotated by the rotation mechanism is an axis approximately parallel to the horizontal direction (orthogonal to the direction of the gravity). Moreover, the air tightness inside the chamber 3 is kept even at the time of the rotation of the container 129.

Further, the plasma CVD apparatus is provided with a raw gas introducing mechanism and an evacuation mechanism. The raw gas introducing mechanism has a tubular gas shower electrode 24. And, the plasma CVD apparatus is provided with a plasma power supplying mechanism. The plasma power supplying mechanism has a plasma power source 25 connected to the gas shower electrode 24 via a switch 33, or the ground potential, wherein both are constituted so as to be switchable by the switch 33 (see Patent Document 1).

[Patent Document 1] Japanese Patent Laid-Open Publication No. 2006-16661 (paragraphs 83 to 92, FIG. 7)

SUMMARY OF THE INVENTION

Incidentally, the above-described conventional plasma CVD apparatus can not generate plasma intensively near fine particles 1 housed in the container 129, but plasmas are generated in regions separated from fine particles 1 in the container and plasmas spread wholly and disperse. Consequently, there is such a problem that the amount of applied electric power becomes large relative to the amount of coated fine particles to be obtained to thereby lower the energy efficiency.

Moreover, since fine particles having small diameters have such properties that they agglutinate, it was not easy to sufficiently stir such fine particles.

The present invention has been achieved in consideration of the above-described circumstances, and objects thereof are to provide a plasma CVD apparatus and a plasma CVD method capable of coating the surfaces of fine particles or electronic parts efficiently with a thin film or super-fine particles by concentrating a plasma near the fine particles or the electronic parts.

Another object of the present invention is to provide an agitating device capable of sufficiently agitating fine particles or electronic parts having small diameters.

In order to solve the above problem, the plasma CVD apparatus according to the present invention is provided with a chamber, a container disposed in the chamber for housing fine particles or electronic parts, the container having a circular inner shape in a section approximately parallel to the direction of the gravity, a ground shielding member for shielding the surface of the container other than a housing face for housing the fine particles or the electronic parts, a rotation mechanism for causing the container to rotate or act as a pendulum on the axis of rotation approximately perpendicular to the section, an opposed electrode disposed in the container so as to face the housing face, a plasma power source electrically connected to the container, a gas introducing mechanism for introducing a raw gas into the container, and an evacuation mechanism for evacuating the inside of the chamber, wherein a plasma CVD method is used while agitating or rotating the fine particles or the electronic parts in the container by using the rotation mechanism for causing the container to rotate or act as a pendulum, thereby coating the surfaces of the fine particles or the electronic parts with super-fine particles having smaller diameters than the fine particles or the electronic parts, or with a thin film.

Meanwhile, the super-fine particles mean fine particles having smaller particle diameters than the fine particles. States in which the surfaces of the fine particles are coated with super-fine particles include a state in which the surfaces of the fine particles are coated with super-fine particles continuously or discontinuously, a state in which the surfaces of the fine particles are coated with aggregates of the super-fine particles continuously or discontinuously, and a state in which the super-fine particles and the aggregates of the super-fine particles are mixed and continuously or discontinuously coated.

According to the plasma CVD apparatus, the surface of the container other than the housing face for housing the fine particles or the electronic parts is shielded by the ground shielding member. Therefore, it is possible to generate a plasma between the housing face and the opposed electrode facing it and to concentrate a plasma electric power to the housing face, and as the result, to supply a plasma electric power intensively to the fine particles or the electronic parts placed on the housing face. Accordingly, by concentrating the plasma near the fine particles or the electronic parts, it becomes possible to coat the surfaces of the fine particles or the electronic parts efficiently with a thin film or super-fine particles.

Further, in the plasma CVD apparatus according to the present invention, the container preferably has a first container member having a circular inner shape in a section, a first ring-shaped member and a second ring-shaped member disposed facing the first ring-shaped member, wherein:

each outer circumference of the first and second ring-shaped members is connected to the inner surface of the first container member, each inner circumference of the first and second ring-shaped members is placed on the opposed electrode side from the inner surface of the first container member, and the housing face is preferably formed by the surfaces of the first and second ring-shaped members facing each other and the inner surface of the first container member.

According to the plasma CVD apparatus, the housing face is formed by the surfaces of the first and second ring-shaped members facing each other and the inner surface of the first container member, and the surface of the container other than the housing face is shielded by the ground shielding member. Therefore, it is possible to generate the plasma between the housing face and the opposed electrode facing it and to concentrate a plasma electric power to the housing face, and as the result, to supply the plasma electric power intensively to fine particles or electronic parts placed on the housing face.

The plasma CVD apparatus according to the present invention is provided with a chamber, a container disposed in the chamber for housing fine particles or electronic parts, the container having a polygonal inner shape in a section approximately parallel to the direction of the gravity, a ground shielding member for shielding the surface of the container other than a housing face for housing the fine particles or the electronic parts, a rotation mechanism for causing the container to rotate or act as a pendulum on the axis of rotation approximately perpendicular to the section, an opposed electrode disposed in the container so as to face the housing face, a plasma power source electrically connected to the container, a gas introducing mechanism for introducing a raw gas into the container, and an evacuation mechanism for evacuating the inside of the chamber, wherein a plasma CVD method is used while agitating or rotating the fine particles or the electronic parts in the container by using the rotation mechanism for causing the container to rotate or act as a pendulum, thereby coating the surfaces of the fine particles or the electronic parts with super-fine particles having smaller diameters than the fine particles or the electronic parts, or with a thin film.

Moreover, in the plasma CVD apparatus according to the present invention, the container preferably has the first container member having a circular inner shape in a section, a second container member that is disposed in the first container member and has a polygonal inner shape in a section, a first ring-shaped member disposed in the first container member and placed on one side of the second container member, and a second ring-shaped member disposed in the first container member and placed on the other side of the second container member, wherein:

each outer circumference of the first and second ring-shaped members is connected to the inner surface of the first container member, each inner circumference of the first and second ring-shaped members is placed on the opposed electrode side from the inner surface of the second container member, and the housing face is preferably formed by the surfaces of the first and second ring-shaped members facing each other and the inner surface of the second container member.

Further, in the plasma CVD apparatus, there may additionally be provided a ground shielding member for shielding the surface of the opposed electrode other than an opposed surface facing the fine particles or the electronic parts housed in the container when the rotation mechanism causes the container to rotate or act as a pendulum.

Furthermore, in the plasma CVD apparatus, there may additionally be provided a second plasma power source electrically connected to the opposed electrode.

Furthermore, in the plasma CVD apparatus, there may additionally be provided a striking member for being struck against the ground shielding member in order to give a vibration to the fine particles or the electronic parts housed in the container.

Moreover, in the plasma CVD apparatus, preferably there is additionally provided plural grounding plates disposed between one end of the first container member and the opposed electrode. Consequently, the grounding plate works as the opposed electrode to make it possible to generate a plasma between the grounding plate and the housing face. Mutual distances between the plural grounding plates are preferably 5 mm or less, more preferably 3 mm or less.

The plasma CVD apparatus according to the present invention is provided with a chamber, a container disposed in the chamber for housing fine particles or electronic parts, the container having a circular inner shape in a section approximately parallel to the direction of the gravity, a rotation mechanism for causing the container to rotate or act as a pendulum on the axis of rotation approximately perpendicular to the section, an opposed electrode disposed in the container so as to face the inner surface of the container, a ground shielding member for shielding the surface of the opposed electrode other than an opposed surface facing the fine particles or the electronic parts housed in the container when the rotation mechanism causes the container to rotate or act as a pendulum, a plasma power source electrically connected to the opposed electrode, a gas introducing mechanism for introducing a raw gas into the container, and an evacuation mechanism for evacuating the inside of the chamber, wherein a plasma CVD method is used while agitating or rotating the fine particles or the electronic parts in the container by using the rotation mechanism for causing the container to rotate or act as a pendulum, thereby coating the surfaces of the fine particles or the electronic parts with super-fine particles having smaller diameters than the fine particles or the electronic parts, or with a thin film.

According to the above plasma CVD apparatus, the surface of the opposed electrode other than the opposed surface facing the fine particles or the electronic parts housed in the container when the rotation mechanism causes the container to rotate or act as a pendulum is shielded by the ground shielding member. Consequently, it is possible to generate a plasma between the opposed surface and the inner surface of the container facing it, and to concentrate a plasma electric power to the opposed surface, and as the result, to supply the plasma electric power intensively to the fine particles or the electronic parts housed in the container. Accordingly, by concentrating the plasma near the fine particles or the electronic parts, it becomes possible to coat the surfaces of the fine particles or the electronic parts efficiently with a thin film or super-fine particles.

Further, in the plasma CVD apparatus according to the present invention, the minimum diameter or gap is preferably 5 mm or less, more preferably 3 mm or less, in the pathway through which gas is evacuated from the inside of the container to the outside of the chamber by the evacuation mechanism. This allows the suppression of the dispersion of the plasma, and also an abnormal discharge.

Furthermore, in the plasma CVD apparatus according to the present invention, there may additionally be provided magnetic substance particles housed in the container, an electromagnet for supplying electromagnetic power to the magnetic substance particles, and a power source for supplying current to the electromagnet in a pulse shape to supply the electromagnetic power to the magnetic substance particles in a pulse shape, thereby agitating the magnetic substance particles.

The plasma CVD apparatus according to the present invention is provided with a chamber, a container disposed in the chamber for housing fine particles, the container having a polygonal inner shape in a section approximately parallel to the direction of the gravity, a rotation mechanism for causing the container to rotate or act as a pendulum on the axis of rotation approximately perpendicular to the section, an opposed electrode disposed in the container so as to face the inner surface of the container, a ground shielding member for shielding the surface of the opposed electrode other than an opposed surface facing the fine particles housed in the container when the rotation mechanism causes the container to rotate or act as a pendulum, a plasma power source electrically connected to the opposed electrode, a gas introducing mechanism for introducing a raw gas into the container, and an evacuation mechanism for evacuating the inside of the chamber, wherein a plasma CVD method is used while agitating or rotating the fine particles in the container by using the rotation mechanism for causing the container to rotate or act as a pendulum, thereby coating the surfaces of the fine particles with super-fine particles having smaller diameters than the fine particles, or with a thin film.

The plasma CVD apparatus according to the present invention is provided with a chamber, a container disposed in the chamber for housing electronic parts, the container having a polygonal inner shape in a section approximately parallel to the direction of the gravity, a rotation mechanism for causing the container to rotate or act as a pendulum on the axis of rotation approximately perpendicular to the section, an opposed electrode disposed in the container so as to face the inner surface of the container, a ground shielding member for shielding the surface of the opposed electrode other than an opposed surface facing the electronic parts housed in the container when the rotation mechanism causes the container to rotate or act as a pendulum, a plasma power source electrically connected to the opposed electrode, a gas introducing mechanism for introducing a raw gas into the container, and an evacuation mechanism for evacuating the inside of the chamber, wherein a plasma CVD method is used while agitating or rotating the electronic parts in the container by using the rotation mechanism for causing the container to rotate or act as a pendulum, thereby coating the surfaces of the electronic parts with super-fine particles having smaller diameters than the electronic parts, or with a thin film.

Furthermore, in the plasma CVD apparatus according to the present invention, there may additionally be provided magnetic substance particles housed in the container, an electromagnet for supplying electromagnetic power to the magnetic substance particles, and a power source for supplying current to the electromagnet while inverting the polarity to supply the electromagnetic power to the magnetic substance particles while inverting the polarity, thereby agitating the magnetic substance particles.

Moreover, in the plasma CVD apparatus according to the present invention, there may additionally be provided magnetic substance particles housed in the container, an electromagnet for supplying electromagnetic power to the magnetic substance particles, and an oscillating mechanism for oscillating the electromagnet to supply the electromagnetic power to the magnetic substance particles while oscillating the electromagnet, thereby agitating the magnetic substance particles.

Furthermore, in the plasma CVD apparatus according to the present invention, there may additionally be provided a power source for giving an ultrasonic vibration to the electromagnet.

Moreover, in the plasma CVD apparatus according to the present invention, the surfaces of the magnetic substance particles are preferably coated with DLC fine particles or a DLC film.

In addition, in the plasma CVD apparatus according to the present invention, the opposed electrode preferably has a surface on the side opposed to the direction of the gravity, which is convex to the opposed side.

Furthermore, in the plasma CVD apparatus according to the present invention, the plasma power source is preferably a high-frequency power source of 50 to 500 kHz.

The plasma CVD method according to the present invention includes the steps of housing fine particles or electronic parts in a container having a circular inner shape in a section approximately parallel to the direction of the gravity, shielding the surface of the container other than a housing face for housing the fine particles or the electronic parts with a ground shielding member, disposing an opposed electrode facing the housing face in the container, evacuating the inside of the container, causing the container to rotate or act as a pendulum on the axis of rotation approximately perpendicular to the section, introducing a raw gas into the container, and supplying a plasma power to the container to coat the surfaces of the fine particles or the electronic parts with super-fine particles having smaller diameters than the fine particles or the electronic parts, or with a thin film by a plasma CVD method while agitating or rotating fine particles or electronic parts in the container.

The plasma CVD method according to the present invention includes the steps of housing fine particles or electronic parts in a container having a polygonal inner shape in a section approximately parallel to the direction of the gravity, shielding the surface of the container other than a housing face for housing the fine particles or the electronic parts with a ground shielding member, disposing an opposed electrode facing the housing face in the container, evacuating the inside of the container, causing the container to rotate or act as a pendulum on the axis of rotation approximately perpendicular to the section, introducing a raw gas into the container, and supplying a plasma power to the container to coat the surfaces of the fine particles or the electronic parts with super-fine particles having smaller diameters than the fine particles or the electronic parts, or with a thin film by a plasma CVD method while agitating or rotating fine particles or electronic parts in the container.

The agitating device according to the present invention is provided with a container for housing fine particles or electronic parts, magnetic substance particles housed in the container, an electromagnet that is disposed outside the container, and which supplies an electromagnetic power to the magnetic substance particles, and a power source for supplying a current to the electromagnet in a pulse shape, wherein an electromagnetic power is supplied to the magnetic substance particles in a pulse shape to stir the magnetic substance particles.

The agitating device according to the present invention is provided with a container for housing fine particles or electronic parts, magnetic substance particles housed in the container, an electromagnet that is disposed outside the container, and which supplies an electromagnetic power to the magnetic substance particles, and a power source for supplying a current to the electromagnet while inverting the polarity, wherein an electromagnetic power is supplied, while inverting the polarity, to the magnetic substance particles to stir the magnetic substance particles.

The agitating device according to the present invention is provided with a container for housing fine particles or electronic parts, magnetic substance particles housed in the container, an electromagnet that is disposed outside the container, and which supplies an electromagnetic power to the magnetic substance particles, and an oscillating mechanism for oscillating the electromagnet, wherein an electromagnetic power is supplied, while oscillating the electromagnet, to the magnetic substance particles to stir the magnetic substance particles.

As described above, according to the present invention, it is possible to provide a plasma CVD apparatus and a plasma CVD method capable of coating the surfaces of fine particles or electronic parts efficiently with a thin film or super-fine particles by concentrating a plasma near fine particles.

Moreover, according to another invention, it is possible to provide an agitating device capable of sufficiently agitating fine particles or electronic parts having small diameters.

BRIEF DESCRIPTION OF THE DRAWINGS

FIG. 9 (A) is a cross-sectional view showing the outline of a conventional plasma CVD apparatus, and FIG. 9 (B) is a cross-sectional view along the 7B-7B line shown in FIG. 9 (A).

Figure 1:
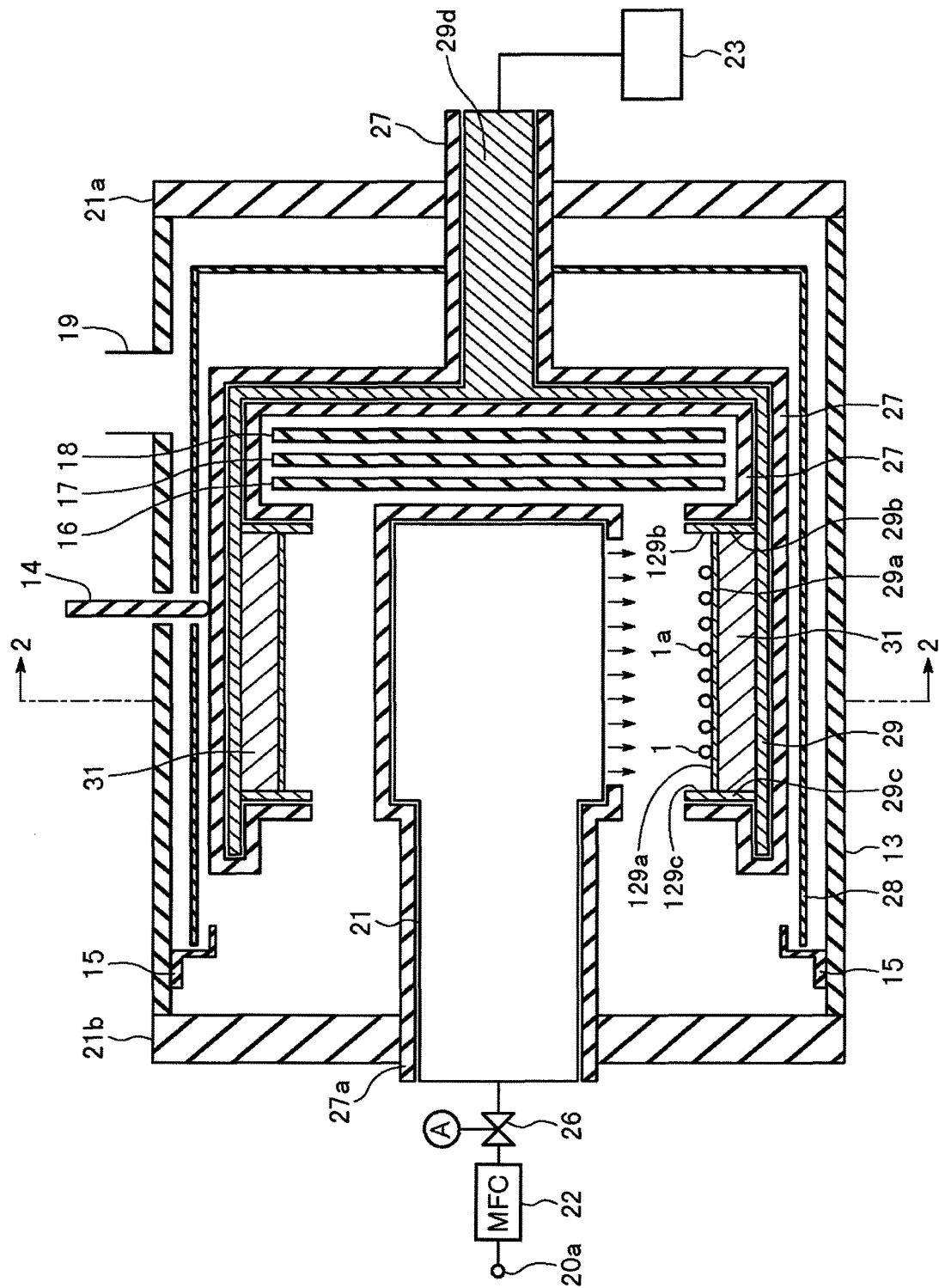
FIG. 1 is a cross-sectional view showing a plasma CVD apparatus by an embodiment according to the present invention.

DESCRIPTION OF REFERENCE NUMERALS AND SIGNS 1. a granular material (fine particle),
1a. a magnetic substance particle,
3, 13. a chamber,
11. the direction of the gravity,
12. an electromagnet,
12a. a pulse-controllable power source,
12b. an ultrasonic vibration-controllable electrode,
12c. a polarity inversion-controllable power source,
12d. an oscillating mechanism,
14. a grounding rod,
15. a ground shielding member,
16. to 18 a grounding plate,
19. an exhaust port,
20, 21a, 21b. a chamber cover,
20a. a raw gas-generating source,
21,24. a gas shower electrode,
22. a mass flow controller (MFC),
23, 25, 34. a plasma power source,
26. a vacuum valve,
27, 27a. a ground shielding member,
28. a ground shielding body,
29. a first container member,
29a. a second container member,
29b. a first ring-shaped member,
29c. a second ring-shaped member,
29d. an extending portion,
30. a container,
31. a metal member,
32, 33. a switch,
129. a container,
129a. an inner surface constituting a polygon in the second container member,
129b. the surface of the first ring-shaped member,
129c. the surface of the second ring-shaped member

DETAILED DESCRIPTION OF THE INVENTION

Hereinafter, embodiments of the present invention will be explained with reference to the drawings.

Figure 2:
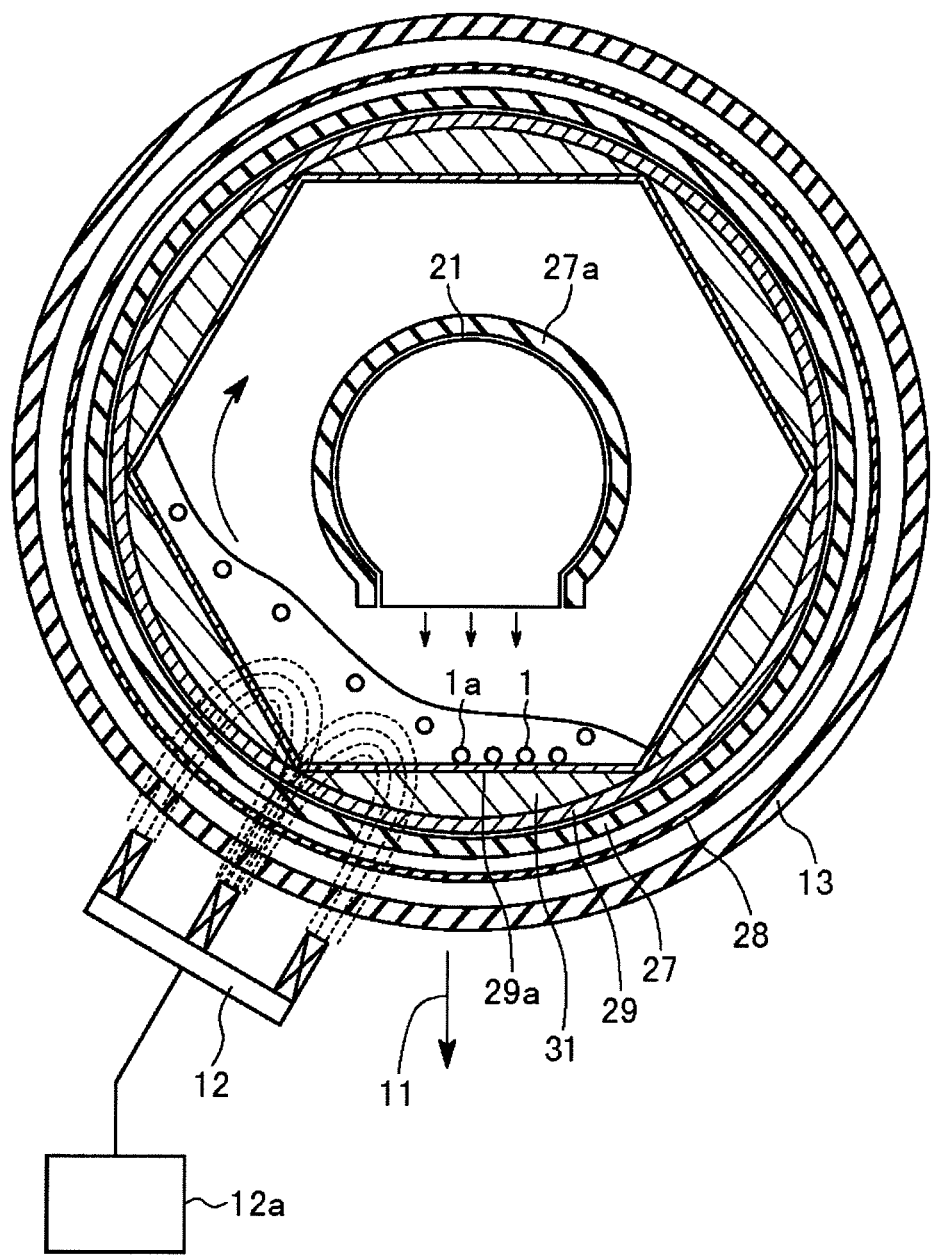
FIG. 2 is a cross-sectional view along the 2-2 line shown in FIG. 1.

FIG. 1 is a cross-sectional view showing the plasma CVD apparatus by an embodiment according to the present invention. FIG. 2 is a cross-sectional view along the 2-2 line shown in FIG. 1. The plasma CVD apparatus is an apparatus for coating the surfaces of fine particles (or granular materials) with super-fine particles having diameters smaller than the fine particles, or with a thin film.

Meanwhile, in the embodiment, the plasma CVD apparatus for coating fine particles with super-fine particles or a thin film is explained, but the plasma CVD apparatus according to the embodiment can be used as an apparatus for coating the surfaces of electronic parts having diameters of 1 mm or less, in place of the fine particles, with fine particles having diameters smaller than the electronic parts, or with a thin film.

Furthermore, in the embodiment, the plasma CVD apparatus, in which the container having a polygonal inner shape in a section houses fine particles and the fine particles are coated with super-fine particles, or with a thin film, is explained, but the inner shape in a section of the container is not limited to a polygon and is also capable of being circular or elliptical. The difference between the container having a polygonal inner shape in a section and the container having a circular or elliptical inner shape in a section lies in that a polygonal container can coat fine particles having smaller diameters with super-fine particles, or with a thin film as compared with a circular or elliptical container.

As shown in FIGS. 1 and 2, the plasma CVD apparatus has the chamber 13 of a cylindrical shape. One end of the chamber 13 is closed with a chamber cover 21a, and the other end of the chamber 13 is closed with a chamber cover 21b. Each of the chamber 13, and the chamber covers 21a and 21b is connected to the earth (ground potential).

Inside the chamber 13, the ground shielding body 28 of a cylindrical shape is disposed. One end of the ground shielding body 28 is closed, and the other end of the ground shielding body 28 is opened. The ground shielding body 28 is connected to the ground potential.

Inside the ground shielding body 28, an electroconductive container for housing fine particles 1 is disposed. The container has a first container member 29, a second container member 29a, a first ring-shaped member 29b, and a second ring-shaped member 29c. Each of the first container member 29, the second container member 29a, the first and second ring-shaped members 29b and 29c has conductive properties.

Inside the ground shielding body 28, the first container member 29 of a cylindrical shape is disposed. One end of the first container member 29 is closed, and on one end side of the first container member 29, an extending portion 29d extending to the outside of the ground shielding body 28 and the chamber 13 is formed. The other end of the first container member 29 is opened. The extending portion 29d is electrically connected to the plasma power source 23. The plasma power source 23 may be any of a high-frequency power source for supplying high-frequency power (RF output), a power source for microwave and a power source for DC discharge, or any of a pulse-modified high-frequency power source, power source for microwave and power source for DC discharge.

Inside the first container member 29, the second container member 29a is disposed, wherein the second container member 29a has a barrel shape with a hexagonal section as shown in FIG. 2 and the section shown in FIG. 2 is a section approximately parallel to the direction of the gravity 11. Meanwhile, in the embodiment, the second container member 29a of a hexagonal barrel shape is used, but the member is not limited to it, and a second container member of a polygonal barrel shape other than the hexagonal one is also capable of being employed.

One end of the second container member 29a is attached to the inside of the first container member 29 by the first ring-shaped member 29b, and the other end of the second container member 29a is attached to the inside of the first container member 29 by the second ring-shaped member 29c. In other words, the first ring-shaped member 29b is placed on one side of the second container member 29a, and the second ring-shaped member 29c is placed on the other side of the second container member 29a. Each outer circumference of the first and second ring-shaped members is connected to the inner surface of the first container member 29, and each inner circumference of the first and second ring-shaped members is placed on the gas shower electrode (opposed electrode) 21 side, instead of the inner surface side of the second container member 29a. Moreover, the region surrounded by the first container member 29, the second container member 29a, and the first and second ring-shaped members 29b and 29c is filled in with the metal member 31.

The distance between the first ring-shaped member 29b and the second ring-shaped member 29c (that is, the distance from one end to the other end of the second container member 29a) is smaller as compare with the distance from one end to the other end of the first container member 29. Moreover, each of the first and second ring-shaped members 29b and 29c is disposed inside the first container member 29. And, it is constituted such that, in a space surrounded by the inner surface of the second container member 29a, and the first and second ring-shaped members 29b and 29c, granular materials (fine particles) 1 as the object to be coated are housed. In other words, the inner surface 129a constituting a polygon in the second container member 29a, and each of surfaces 129b and 129c of the first and second ring-shaped members surrounding the inner surface 129a (surfaces in which the first and second ring-shaped members face each other) constitute the housing face, and fine particles 1 are placed over the housing face.

Moreover, it is constituted such that high-frequency power is supplied to the second container member 29a by the plasma power source 23 via the first container member 29, the metal member 31 and the first and second ring-shaped members 29b and 29c. Consequently, the second container member 29a can also function as an electrode and supply the high-frequency power to granular materials 1 housed inside the container.

The surface of the container other than the housing face made up of the inner surface constituting a polygon 129a of the second container member 29a and each of surfaces 129b and 129c of the first and second ring-shaped members surrounding the inner surface 129a is covered with the ground shielding member 27. The first container member 29, and each of the first and second ring-shaped members 29b and 29c have a distance of 5 mm or less (preferably 3 mm or less) from the ground shielding member 27. The ground shielding member 27 is connected to the ground potential. By covering the first container member 29, to which high-frequency power is supplied, with the ground shielding member 27 as described above, the high-frequency output can be concentrated inside the second container member 29a, and as the result, it becomes possible to supply the high-frequency power intensively to the granular materials 1 housed in the container. In other words, the present embodiment can reduce the area of a plasma source for generating plasma such as the housing face to about ⅓ as compared with conventional plasma CVD apparatuses, and therefore, can reduce the high-frequency power amount to about ⅓ as compared with conventional plasma CVD apparatuses.

Moreover, the plasma CVD apparatus is provided with a raw gas introducing mechanism for introducing a raw gas into the chamber 13. The raw gas introducing mechanism has a tubular gas shower electrode (opposed electrode) 21.

The gas shower electrode 21 is disposed in the second container member 29a. That is, the second container member 29a has an opening formed on the other side thereof, and from the opening, the gas shower electrode 21 is inserted. The gas shower electrode 21 is connected to the ground.

The surface of the gas shower electrode (opposed electrode) 21 other than the opposed surface facing the fine particles 1 housed in the container is shielded by the ground shielding member 27a. The ground shielding member 27a has a distance of 5 mm or less (preferably 3 mm or less) from the gas shower electrode 21.

In the opposed surface on one side of the gas shower electrode 21, gas nozzles for ejecting a raw gas or raw gases in a shower shape are formed. The gas nozzles are disposed at the bottom portion of the gas shower electrode 21 (the opposed surface), and are disposed so as to face the granular materials 1 housed in the second container member 29a. That is, the gas nozzles are disposed so as to face the inner surface of the second container member 29a. Moreover, as shown in FIG. 2, the surface of the gas shower electrode 21 on the opposite side relative to the direction of the gravity 11 has a convex shape toward the opposite side. In other words, the gas shower electrode 21 has a circular or elliptical shape in a section except for the bottom portion. Consequently, even if the granular materials 1 are on the circular or elliptical portion (portion of a convex shape) when the second container member 29a is being rotated, the granular materials 1 can be fallen from the gas shower electrode 21.

The other side of the gas shower electrode 21 is connected to one side of a mass flow controller (MFC) 22 via a vacuum valve 26. The other side of the mass flow controller 22 is connected to a raw gas-generating source 20a via a vacuum valve, a filter and the like, which are not shown. The raw gas-generating source 20a generates different kinds of raw gases depending on the thin film for coating the granular materials 1, and for example, when a SiO$_2$ film is to be formed, SiH$_4$ gas or the like is to be generated.

The other side of the gas shower electrode 21 is connected to one side of a mass flow controller (MFC) that is not shown via a vacuum valve (not shown). The other side of the mass flow controller is connected to an argon gas cylinder (not shown).

The first container member 29 is provided with a rotation mechanism (not shown). The rotation mechanism causes the first container member 29 and the second container member 29a to rotate or act as a pendulum as the arrow shown in FIG. 2 around the gas shower electrode 21 as a rotation center to stir or rotate the granular materials (fine particles) 1 in the second container member 29a, and thus, the coating treatment is carried out. The axis of rotation when causing the first container member 29 and the second container member 29a to rotate by the rotation mechanism is an axis parallel to a direction approximately parallel to the horizontal direction (direction perpendicular to the direction of the gravity 11). The air tightness in the chamber 13 is retained even during the rotation of the first container member 29.

The plasma CVD apparatus is also provided with an evacuation system for evacuating the inside of the chamber 13. For example, the chamber 13 is provided with plural exhaust ports 19, and the exhaust ports 19 are connected to a vacuum pump (not shown).

Between the other end of the ground shielding body 28 and the chamber 13, the ground shielding member 15 is provided. The ground shielding member 15 is attached to the inner surface of the chamber 13, with a crevice of 5 mm or less (preferably 3 mm or less) from the other end of the ground shielding body 28. In other words, the minimum diameter or gap of the pathway from the inside of the first container member 29 to the outside of the chamber 13 through which the gas is exhausted by the evacuation system is set to be 5 mm or less (preferably 3 mm or less). It is constituted such that the raw gas introduced into the second container member 29a from the gas shower electrode 21 passes through the crevice and is exhausted from the exhaust port 19. At this time, by setting the crevice, the minimum diameter or gap to be 5 mm or less, it is possible not to keep the plasma from being confined near the granular materials 1 housed in the second container member 29a. That is, when the crevice, the minimum diameter or gap is set to be more than 5 mm, the plasma might disperse or abnormal discharge might occur. In other words, by setting the crevice, the minimum diameter or gap to be 5 mm or less, the formation of a CVD film on the exhaust port 19 side can be suppressed.

Moreover, the gas shower electrode 21 has a heater (not shown). Between the gas shower electrode 21 and one end of the first container member 29, three grounding plates 16 to 18 are disposed. This makes it possible to cause the discharge to occur between the inner surface of the second container member 29a and the grounding plates 16 to 18. That is, when a CVD film of an insulator is formed on the surface of the gas shower electrode 21 by operating the apparatus for a long time, and as the result, when the discharge does not occur between the gas shower electrode 21 and the second container member 29a, the grounding plates 16 to 18 work as opposed electrodes in place of the gas shower electrode 21, which makes it possible to cause the discharge to occur between the grounding plates 16 to 18 and the inner surface of the second container member 29a. Accordingly, by providing the grounding plates 16 to 18, it becomes possible to operate the apparatus continuously for a long time.

The mutual distance between the grounding plates 16 to 18 is preferably 5 mm or less (more preferably 3 mm or less). This can prevent a CVD film from being formed in mutual gaps of grounding plates 16 to 18. As the result, it becomes possible to operate the apparatus continuously for a long time.

Moreover, the plasma CVD apparatus has a grounding rod 14 as a striking member for giving a vibration to the granular materials 1 housed inside the second container member 29a. That is, it is constituted such that the grounding rod 14 can be struck to the ground shielding member 27 at the tip thereof by a driving mechanism (not shown) through openings provided to each of the chamber 13 and the ground shielding body 28. By continuously striking the grounding rod 14 to the ground shielding member 27 that is rotating with the first container member 29, it becomes possible to give a vibration to the granular materials 1 housed in the second container member 29a. This can prevent the aggregation of granular materials 1 and to accelerate the agitating and mixing of the granular materials 1. Meanwhile, the ground shielding member 27 is connected with the first container member 29 with an insulating member, which is not shown, and therefore, it is constituted such that the vibration from the ground shielding member 27 is transmitted to the first container member 29 via the insulating member.

Moreover, as the plasma power source 23, the use of a high-frequency power source of 50 to 500 kHz is preferable, and the use of a high-frequency power source of 100 to 300 kHz is more preferable. The use of a power source of such low frequency can suppress the dispersion of a plasma toward the outside of the space between the gas shower electrode 21 and the second container member 29a, or the space between the grounding plates 16 to 18 and the second container member 29a, as compared with the case where a power source of a frequency of more than 500 kHz is used. In other words, it is possible to confine the plasma between the gas shower electrode 21 and the second container member 29a, or between the grounding plates 16 to 18 and the second container member 29a. The use of an RF plasma of 50 to 500 kHz hardly generates induction heating in such a closed plasma room, that is, in the barrel (second container member 29a), and gives sufficient $V_{DC}$ to a substrate when a film is formed, and therefore, a hard DLC film tends to be easily formed as shown in the condition of film formation and results of film formation of Example described later. In contrast, the use of such an RF plasma as 13.56 MHz hardly gives $V_{DC}$ to a substrate in the closed plasma room, and a hard DLC film is hardly formed as shown in the condition of film formation and the result of film formation of Comparative Example described later as compared with Example.

Moreover, the plasma CVD apparatus also has an electromagnetic agitating mechanism for agitating or mixing the granular materials 1 by the electromagnet 12. The electromagnetic agitating mechanism has magnetic substance particles 1a housed in a container, an electromagnet 12 for supplying electromagnetic power to the magnetic substance particle 1a, and a pulse-controllable power source 12a for supplying current to the electromagnet 12 in a pulse shape. And, by supplying the electromagnetic power to the magnetic substance particle 1a in a pulse shape, the magnetic substance particles 1a can be stirred. In other words, the repetition of the ON/OFF of the power supply to the electromagnet 12, that is, the pulse input makes it possible to oscillate or vibrate the magnetic substance particles 1a having been mixed with the granular materials 1, which makes it possible to stir or mix the granular materials 1. The magnetic substance particle 1a may be one having a surface coated with DLC (Diamond Like Carbon). In this instance, the thickness of the coated DLC film is preferably about 10% of the particle diameter of the magnetic substance particle. It is considered that the coating of DLC can reduce the friction coefficient of the surface of the magnetic substance particle to 0.2 or less, and improve the agitating efficiency. Since DLC has a contact angle of about 80° and a high wetting property, it is considered that DLC is not adsorbed to the fine particles 1 and can mix the fine particles 1. The magnetic substance particle may also be one formed by coating a thin film of a magnetic substance over the surface of a fine particle of a nonmagnetic substance. But, when the granular material itself being the object to be coated has a magnetic substance, the granular materials can be stirred or mixed by the electromagnetic agitating mechanism even when no other magnetic substance particle is mixed in addition to the granular material being the object to be coated. The magnetic substance particles may have particle sizes larger or smaller than those of the fine particles 1 being the object to be coated.

Meanwhile, in the embodiment, the electromagnetic agitating mechanism having the magnetic substance particles 1a housed in the container, the electromagnet 12 for supplying electromagnetic power to the magnetic substance particles 1a, and the pulse-controllable power source 12a for supplying current to the electromagnet 12 in a pulse shape is used, but the mechanism is not limited to it, and it may be modified and carried out as follows.

Figure 3:
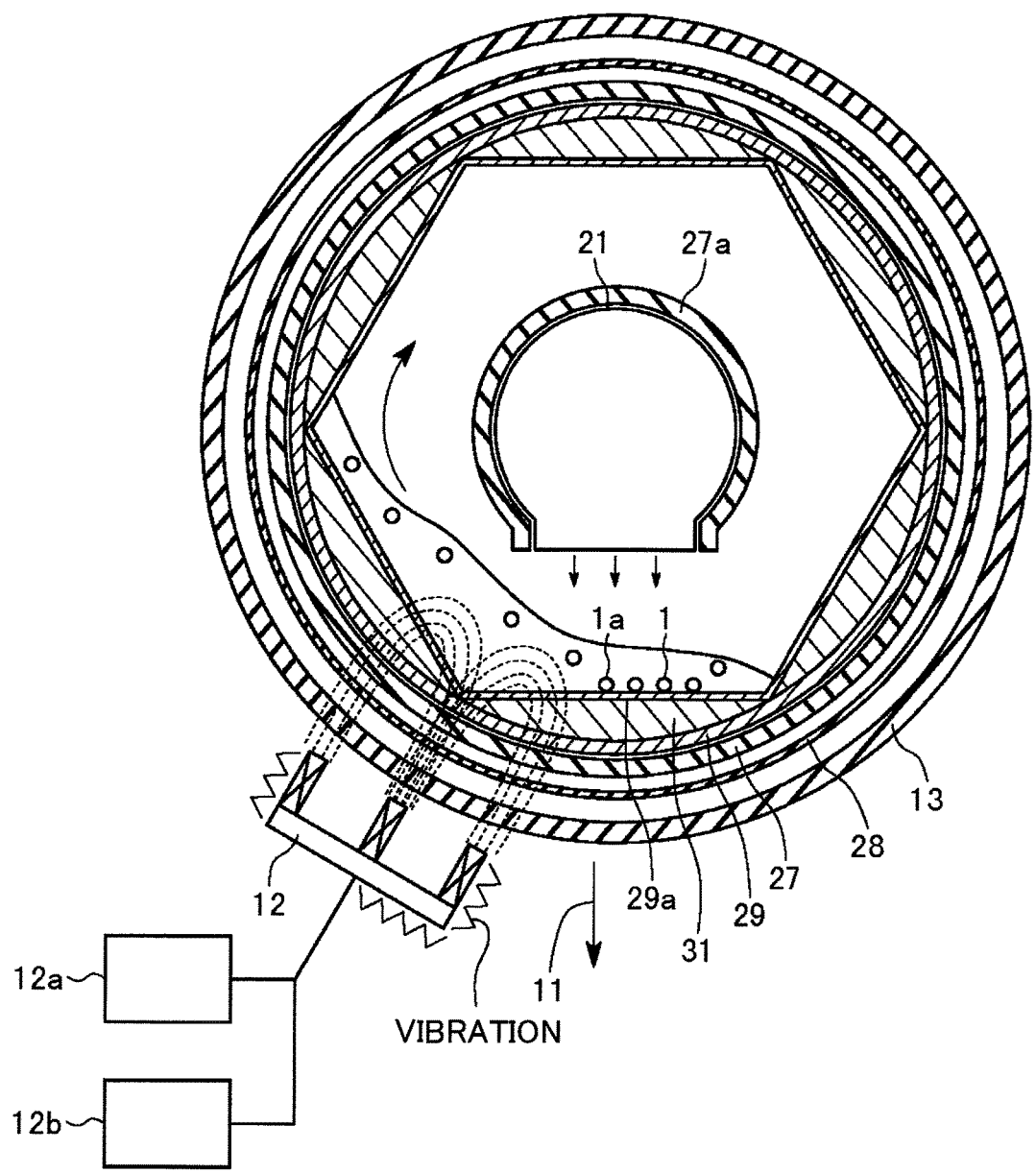
FIG. 3 is a cross-sectional view showing a first modified example of the electromagnetic agitating mechanism by an embodiment of the present invention.

FIG. 3 is a cross-sectional view showing a first modified example of the electromagnetic agitating mechanism according to the embodiment of the present invention, wherein the same portions as those in FIG. 2 are given the same symbols and only different portions are explained.

As shown in FIG. 3, to the electromagnet 12, an ultrasonic vibration-controllable electrode 12b is connected in addition to the pulse-controllable power source 12a. This makes it possible to give ultrasonic vibrations to the electromagnet 12 and to improve the agitation performance as compared with the electromagnetic agitating mechanism shown in FIG. 2.

The first modified example can also give the same effect as that in the above embodiment.

Figure 4:
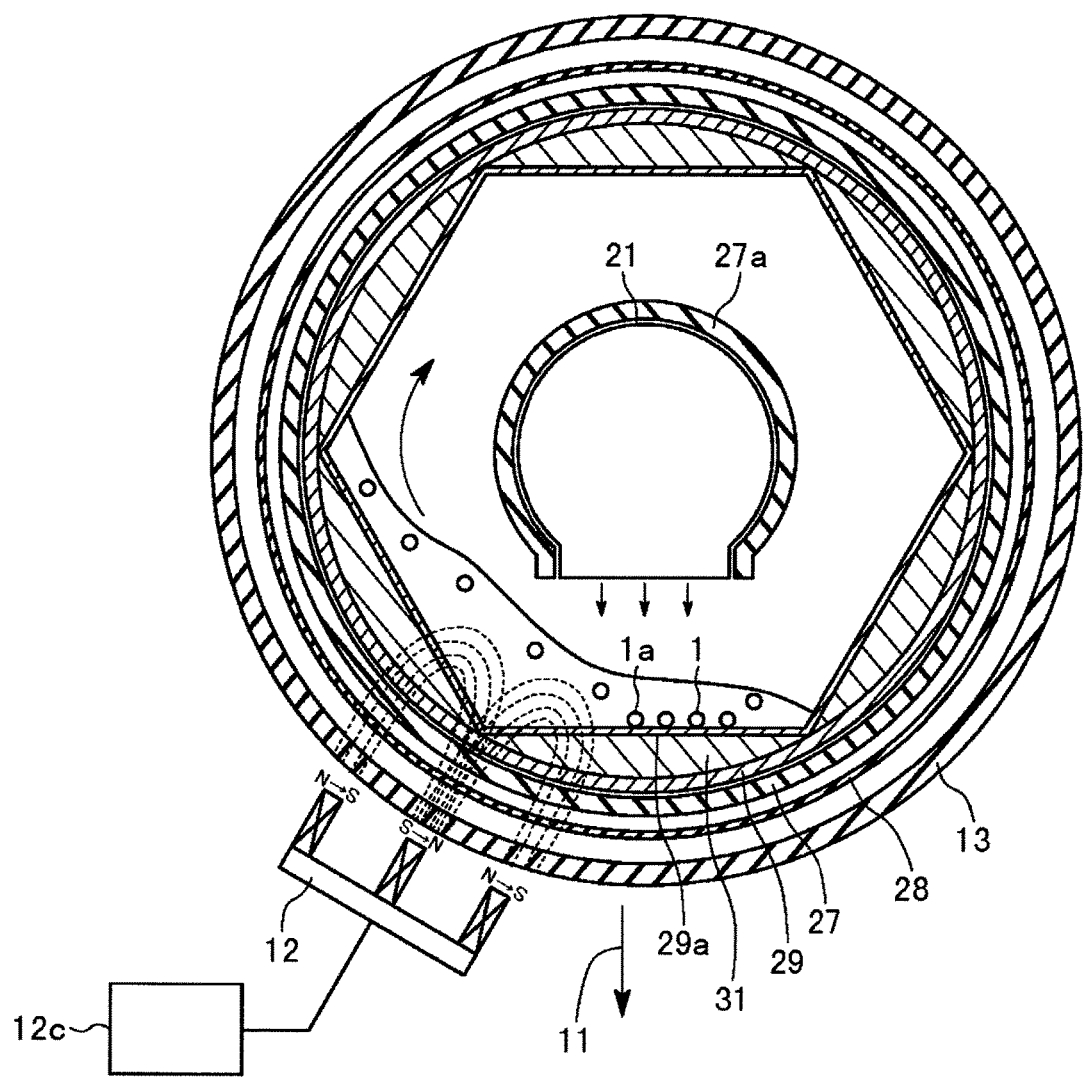
FIG. 4 is a cross-sectional view showing a second modified example of an electromagnetic agitating mechanism by an embodiment of the present invention.

FIG. 4 is a cross-sectional view showing a second modified example of the electromagnetic agitating mechanism according to the embodiment of the present invention, wherein the same portions as those in FIG. 2 are given the same symbols and only different portions will be explained.

As shown in FIG. 4, to the electromagnet 12, a polarity inversion-controllable power source 12c is connected, and the power source 12c supplies current to the electromagnet while inversing the polarity. This can supply electromagnetic power to the magnetic substance particle 1a while inversing the polarity.

The second modified example can also give the same effect as that in the above embodiment.

Meanwhile, in the second modified example, to the electromagnet 12, an ultrasonic vibration-controllable electrode can additionally be connected.

Figure 5:
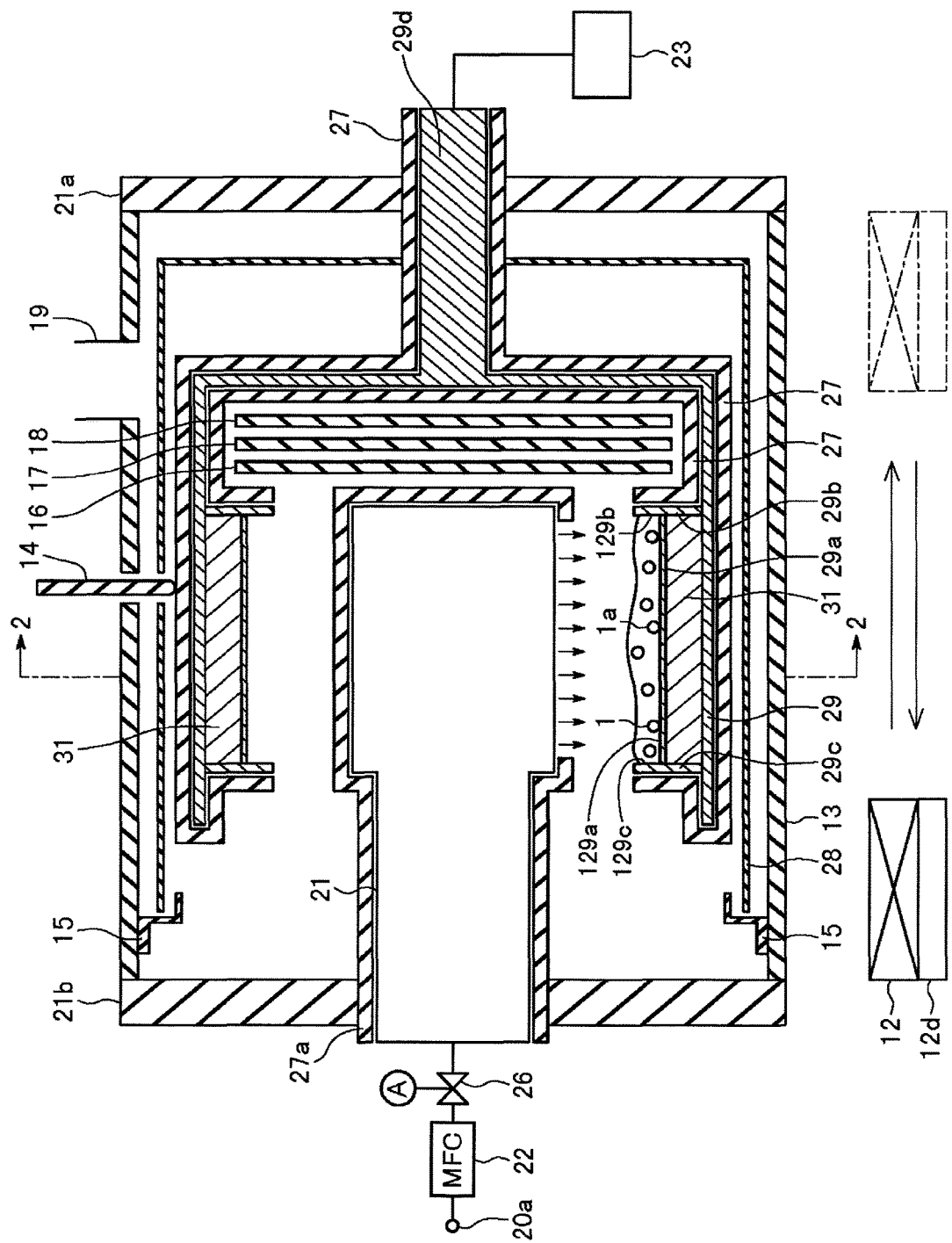
FIG. 5 is a cross-sectional view showing a third modified example of an electromagnetic agitating mechanism by an embodiment of the present invention.

FIG. 5 is a cross-sectional view showing a third modified example of the electromagnetic agitating mechanism according to the embodiment of the present invention, wherein the same portions as those in FIG. 1 are given the same symbols and only different portions will be explained.

As shown in FIG. 5, to the electromagnet 12, an oscillating mechanism 12d for oscillating the electromagnet 12 is attached. This can supply electromagnetic power to the magnetic substance particles 1a while oscillating the electromagnet 12, and as the result, can stir the magnetic substance particles 1a.

The above third modified example can also give the same effect as that in the above embodiment.

Meanwhile, in the third modified example, to the electromagnet 12, an ultrasonic vibration-controllable electrode may additionally be connected.

Moreover, the above-described electromagnetic agitating mechanism can also be grasped as an agitating device. That is, the agitating device is provided with a container for housing fine particles, magnetic substance particles housed in the container, an electromagnet that is disposed outside the container, and which supplies electromagnetic power to the magnetic substance particles, and a power source for supplying current to the electromagnet. The agitating device may also adopt the above-described first to third modified examples.

Next, a plasma CVD method for coating granular materials with super-fine particles or a thin film by using the plasma CVD apparatus will be explained. Here, one in which PMMA (polymethyl methacrylate) is employed as the fine particle 1 being the object to be coated and the fine particles of PMMA are coated with DLC, will be explained as an example.

First, the granular materials (PMMA) 1 made up of plural fine particles are housed in the second container member 29a. The average particle diameter of the granular materials 1 is about 50 μm. Meanwhile, fine particles of PMMA are used as the granular materials 1 here, but other granular materials can be used. To the granular materials 1, the magnetic substance particles 1a are mixed, wherein the surface of the magnetic substance particle is coated with a DLC film. The magnetic substance particles 1a are preferably used when the fine particles 1 have particle diameters of 1 μm or less. That is, when particle diameters of the fine particles 1 are 1 μm or less, the stirring while preventing the aggregation of fine particles is difficult, and the stirring also by the magnetic substance particles 1a is preferable. In other words, when the fine particles 1 have particle diameters of greater than 1 μm, the magnetic substance particles 1a may or may not be used.

After that, by operating a vacuum pump, the pressure inside the chamber 13 is reduced to a prescribed pressure (for example, around $5 \times 10^{-5}$ Torr). Along with this, by rotating the first container member 29 and the second container member 29a through the rotation mechanism, the powders (fine particles) 1 housed inside the second container member 29a are stirred or mixed in the inside of the container. Meanwhile, here, the first container member 29 and the second container member 29a are rotated, but the rotation mechanism can also cause the first container member 29 and the second container member 29a to act as a pendulum.

Subsequently, for example, toluene ($C_7H_8$) is generated in the raw gas-generating source 20a as a raw gas, the flow rate of the toluene is controlled to 7 cc/min by the mass flow controller 22, the flow rate of argon supplied from an argon gas cylinder is controlled to 5 cc/min, and the toluene and argon gas with controlled flow rates are introduced into the inside of the gas shower electrode 21. And, the toluene and argon gas are ejected from the gas nozzle of the gas shower electrode 21. This blows the toluene and argon gas against the fine particles 1 moving in the second container member 29a with the agitation or rotation, and the balance between the controlled flow rates of gases and the evacuation ability maintains the pressure suitable for a film formation by the CVD method.

Moreover, to the ground shielding member 27 rotating with the first container member 29, the grounding rod 14 is repeatedly struck by the driving mechanism. This can give vibration to the granular materials 1 housed in the second container member 29a, to thereby prevent the aggregation of the granular materials 1 and to accelerate the agitating and mixing of the granular materials 1.

Further, the supply of electric power to the electromagnet 12 by a pulse input causes the magnetic substance particles 1a mixed with the granular materials 1 to oscillate or vibrate, thereby accelerating the agitating and mixing of the granular materials 1.

After that, to the first container member 29, an RF output of 150 W and 250 kHz is supplied from a high-frequency power source (RF power source) being an example of the plasma power source 23. This supplies an RF output to the second container member 29a and the granular materials 1 through the first container member 29 and the first and second ring-shaped members 29b and 29c. In this case, the gas shower electrode 21 is connected to the ground potential. This ignites a plasma between the gas shower electrode 21 and the second container member 29a, generates a plasma in the second container member 29a, and coats the surfaces of fine particles 1 of PMMA with super-fine particles or a thin film made up of DLC. That is, since fine particles 1 are stirred and rotated by rotating the second container member 29a, the uniform coating of a thin film over the whole surface of the fine particles 1 can easily be carried out.

Figure 6:
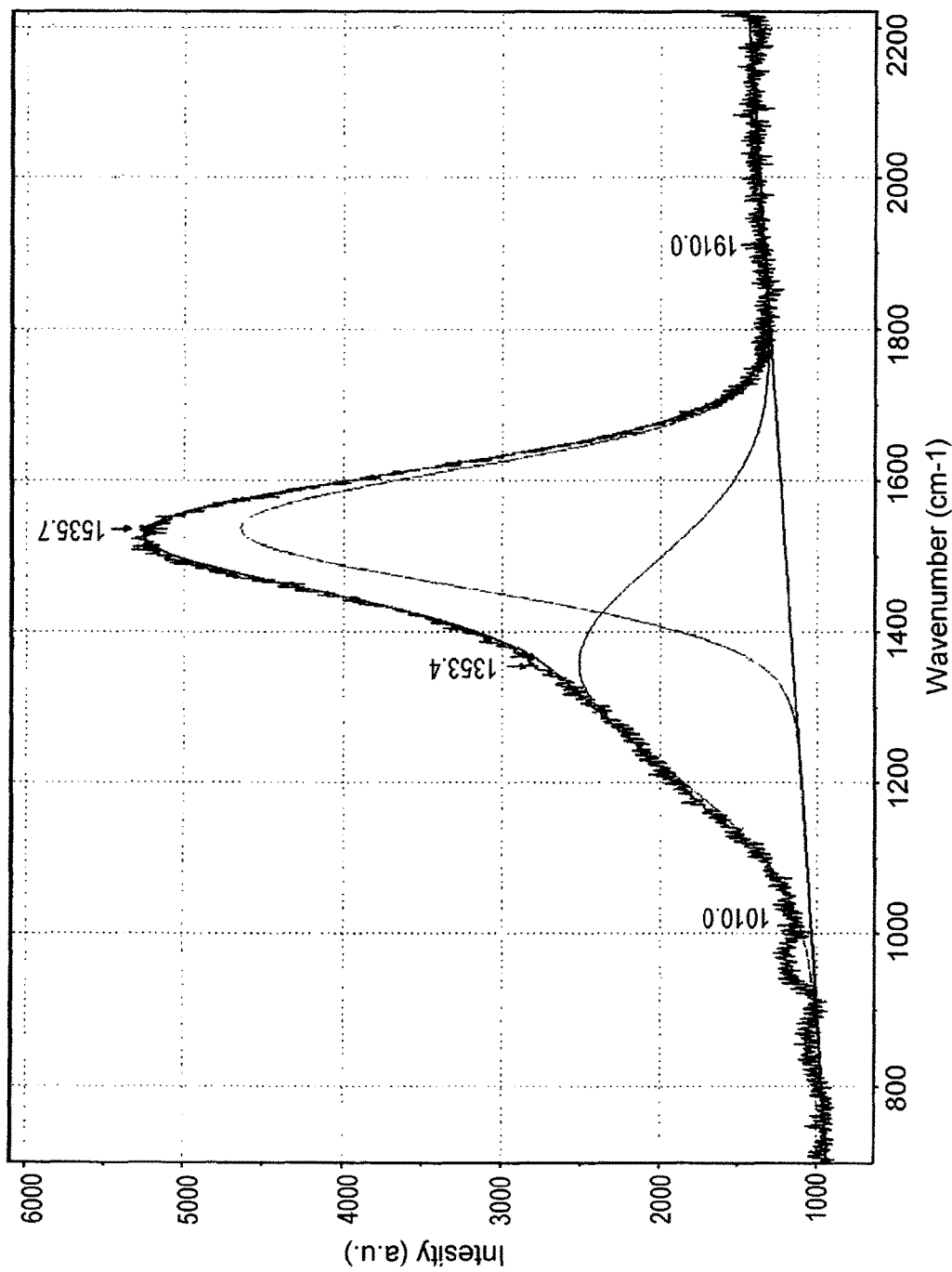
FIG. 6 is a chart showing the analysis result of a typical DLC film by Raman spectroscopy.

FIG. 6 is a chart as Comparative Example, which is the chart obtained by analyzing a DLC film formed on a si wafer with a plasma apparatus of a parallel plate type, by Raman spectroscopic analysis. The DLC film being the object to be analyzed of the chart shown in FIG. 6 was formed under the following condition of film formation.

Figure 7:
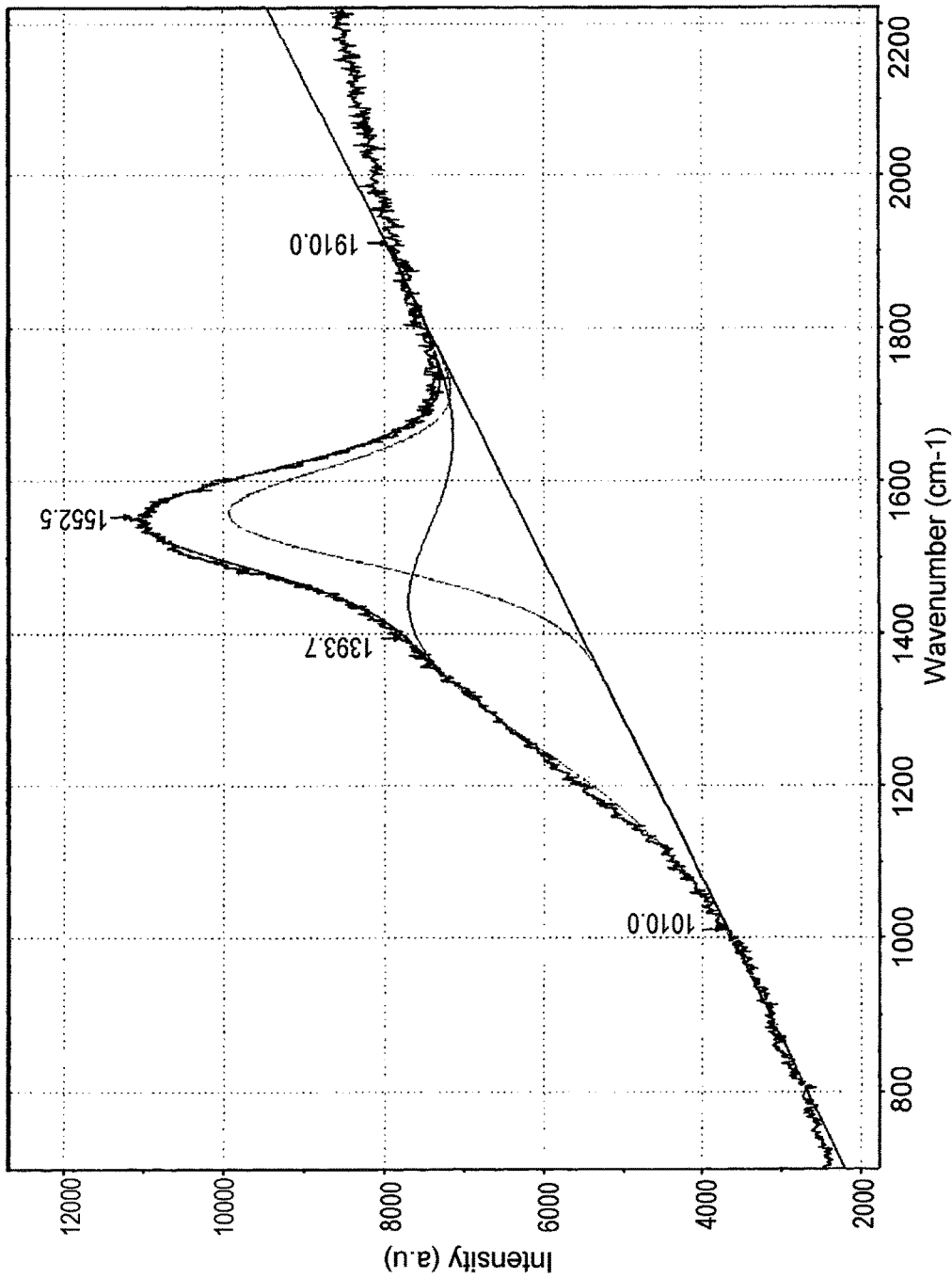
FIG. 7 is a chart showing the analysis result of DLC, with which the surfaces of PMMA fine particles are coated, by Raman spectroscopy.

(Condition of Film Formation)
Plasma apparatus: parallel plate type
Output: 900 W
RF frequency: 13.56 MHz
Raw gas: toluene
Flow rate of raw gas: 10 cc/min
Thickness of DLC film: 100 nm FIG. 7 is a chart showing the result of the analysis of super-fine particles or a thin film made up of DLC, with which the surfaces of fine particles of PMMA having a particle diameter of 50 μm according to the embodiment have been coated, by Raman spectroscopy. FIG. 7 is a chart showing the result of analyzing a typical DLC film by Raman spectroscopy.

(Condition of Film Formation)
Plasma apparatus: polygonal barrel type apparatus in FIG. 1
Output: 150 W
RF frequency: 250 kHz
Raw gas: toluene
Flow rate of toluene: 7 cc/min
Flow rate of Ar: 5 cc/min FIG. 6 shows the typical wave profile of the DLC film. By comparison of the wave profile shown in FIG. 6 with the wave profile shown in FIG. 7, corresponding to super-fine particles or a thin film coated on the fine particles 1 of PMMA according to the embodiment, these wave profiles are nearly the same. Therefore, it can be said that the super-fine particles or the thin film coated according to the embodiment is made of DLC. Accordingly, it was confirmed that the plasma CVD method according to the embodiment can also coat the fine particles with DLC having a good film quality.

Figure 8:
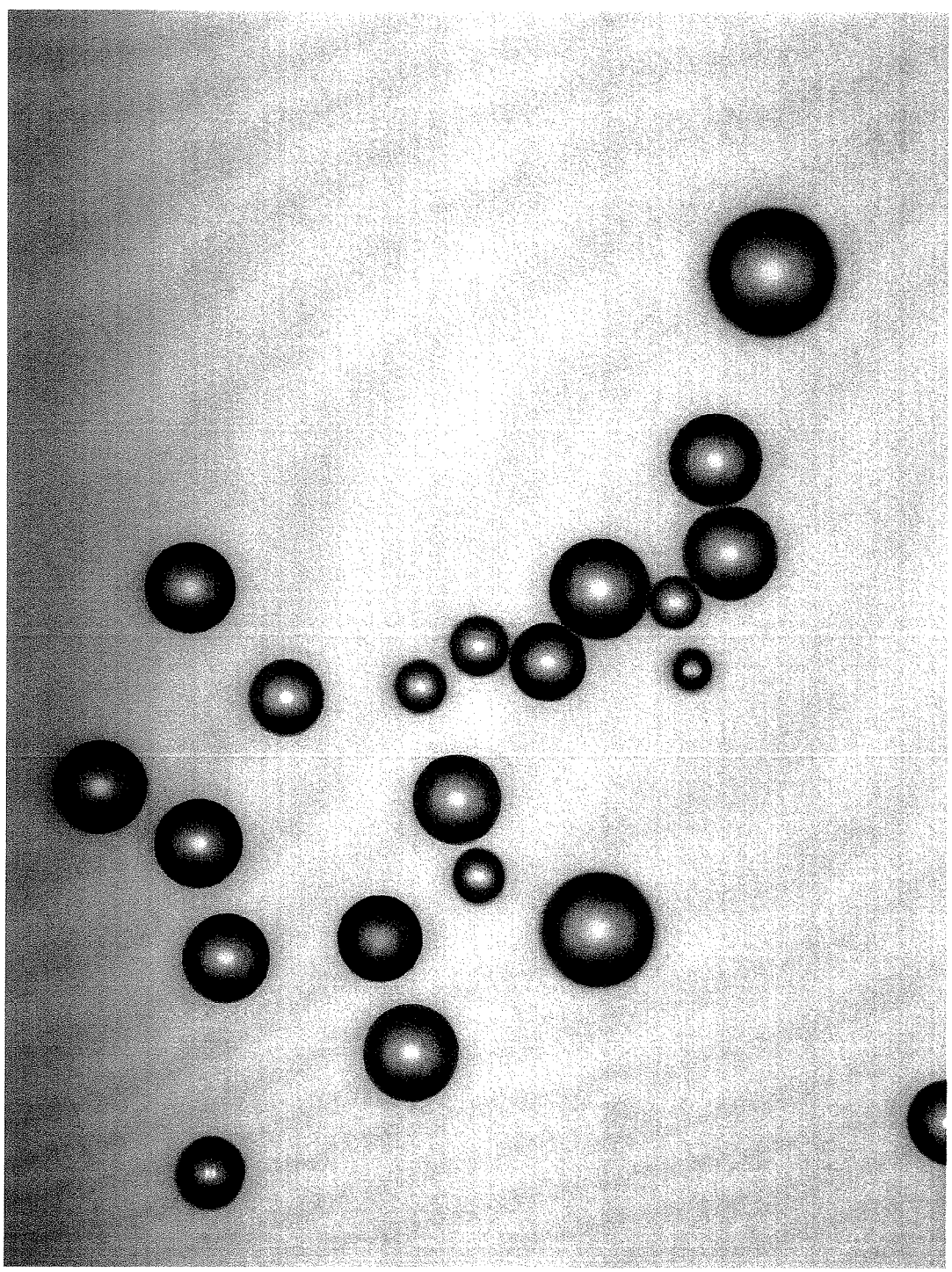
FIG. 8 is a photograph taken with an optical microscope of PMMA fine particles, the surfaces of which are coated with DLC and which have been produced in film-forming conditions in FIG. 7.

FIG. 8 is a photograph of PMMA fine particles coated with DLC on the surface produced by the condition of film formation in FIG. 7, which was taken with an optical microscope.

PMMA fine particles are white, but there is no white fine particle in the photograph of FIG. 8. Therefore, it can be understood that the surface of all PMMA fine particles is coated with DLC.

Further, in the photograph of FIG. 8, each fine particle has a whitish center, and is deeper brown from the center towards the circumference of the fine particle. This shows that all particles reflect light uniformly. If such reflection of light is uniform, DLC is transparent. Therefore, it can be said that the surfaces of all PMMA fine particles are uniformly coated with DLC.

According to the above embodiment, by rotating the second container member 29a itself having a hexagonal barrel shape, it is possible to rotate and stir the granular materials 1 themselves, and further, by forming the barrel into a hexagonal shape, it is possible to periodically drop the granular materials 1 by the gravity. This can dramatically improve the agitation efficiency, and can prevent the aggregation of granular materials caused by moisture or electrostatic force, which frequently is problematic when granular materials are treated. That is, the rotation can simultaneously and effectively carry out the agitation and the pulverization of agglutinated granular materials 1. Accordingly, it becomes possible to coat the fine particles 1 having very small particle diameters with super-fine particles having smaller particle diameters than the fine particles, or with a thin film. Specifically, it becomes possible to coat fine particles having particle diameters of 50 μm or less (especially fine particles having particle diameters of 5 µm or less) with super-fine particles, or with a thin film.

Moreover, in the embodiment, a portion inside the first container member 29 and other than portions where the second container member 29a and the first and second ring-shaped members 29b and 29c are disposed, the outside of the first container member 29, and the side of the ring-shaped member which is opposite to the space for housing the granular materials 1 (that is, the surface of the container other than the housing face for housing the fine particles 1) are covered with the ground shielding member 27. That is, the surface of the container other than the housing face for housing fine particles, which is made up of the inner surface 129a constituting the polygon in the second container member 29a, and each of surfaces 129b and 129c of the first and second ring-shaped members surrounding the inner surface 129a, is covered with the ground shielding member 27. Consequently, a plasma can be generated between the inner surface of the second container member 29a and the gas shower electrode 21 facing it. That is, it is possible to concentrate a high-frequency output inside the second container member 29a, and as the result, to supply high-frequency power intensively to the granular materials 1 housed inside the second container member 29a (that is, the granular materials 1 placed on the housing face), and to effectively supply the high-frequency power to the granular materials 1. Accordingly, it is possible to suppress the adhesion of the DLC film to portions other than the space housing the granular materials 1 surrounded by the inner surface of the second container member 29a, and the first and second ring-shaped members 29b and 29c (the surface of the container other than the above-described housing face). It is also possible to make the amount of high-frequency power smaller than that of conventional plasma CVD apparatuses.

Further, in the embodiment, by repeatedly striking the grounding rod 14 against the ground shielding member 27, the agitating and mixing of the granular materials 1 housed in the second container member 29a can be accelerated. The agitating and mixing of the granular materials 1 can also be accelerated by the electromagnet 12. Accordingly, it becomes possible to coat the fine particles 1 having smaller particle diameters with super-fine particles or a thin film made up of DLC, with a good uniformity.

Meanwhile, the present invention is not limited to the above-described embodiments, but can be practiced with various modifications within the range not departing from the gist of the present invention. For example, conditions of film formation for forming a thin film over the particles may be altered suitably.

And, in the above-described embodiment, a plasma CVD method, in which PMMA is used as the fine particles 1 to be coated and the fine particles 1 of PMMA are coated with DLC, is explained, but the use of the plasma CVD method according to the embodiment is also possible for coating fine particles of a material other than PMMA with super-fine particles or a thin film made up of a material other than DLC.

And, when the inner shape of the container in a section is set as a circle in the above-described embodiment, for example, implementation becomes possible by changing the plasma CVD apparatus shown in FIGS. 1 and 2 to an apparatus in which the second container member 29a and the metal member 31 are eliminated.

And, when the inner shape of the container in a section is set as an ellipsoid in the above-described embodiment, for example, implementation becomes possible by changing the plasma CVD apparatus shown in FIGS. 1 and 2 to an apparatus in which the second container member 29a and the metal member 31 are eliminated and further the inner shape of the first container member 29 in a section is set as an ellipsoid.

And, in the above-described embodiment, a constitution, in which the first container member 29 is connected to the plasma power source 23 and the gas shower electrode 21 is connected to the ground potential, is employed, but the constitution is not limited to this, and can also be changed and practiced as follows. For example, a constitution, in which the first container member 29 is connected to the plasma power source 23 and the gas shower electrode 21 is connected to the second plasma power source, can also be employed. Moreover, a constitution, in which the first container member 29 is connected with the ground potential and the gas shower electrode 21 is connected to the plasma power source, can also be employed, and, in this case, it may be constituted such that a plasma CVD apparatus has no ground shielding member 27. In this instance, the surface of the gas shower electrode (opposed electrode) 21 other than the opposed surface facing the fine particles 1 housed in the container is shielded by the ground shielding member 27a. Therefore, it is possible to concentrate a high-frequency output to the opposed surface, and, as the result, to supply high-frequency power intensively to the granular materials 1 housed inside the second container member 29a (that is, granular materials 1 placed on the housing face) and to supply high-frequency power effectively to the granular materials 1.

EXAMPLES

Comparative Example (Condition of Film Formation)
Plasma CVD apparatus in FIG. 1
Frequency of RF power source: 13.56 MHz
Glass sample: 25×75×1 mm
Flow rate of $C_7H_8$: 7 cc/min
Flow rate of Ar: 3 cc/min
Reaction pressure: 9.8 Pa
RF output: 150 W
Film time (no rotation): 30 min
(Result of Film Formation)
Film thickness: 1.325 µm
Knoop hardness (5 g): 603

Example (Condition of Film Formation)
Plasma CVD apparatus in FIG. 1
Frequency of RF power source: 250 kHz
Glass sample: 25×75×1 mm
Flow rate of $C_7H_8$: 7 cc/min
Flow rate of Ar: 3 cc/min
Reaction pressure: 9.5 Pa
RF output: 150 W
Film time (no rotation): 30 min
(Result of Film Formation)
Film thickness: 1.153 µm
Knoop hardness (5 g): 2072

In the Example, a very hard DLC film was formed. Such hard DLC film is excellent in abrasion resistance.

The invention claimed is:
1. A plasma CVD apparatus comprising:
a chamber provided with an opening, a first container disposed in the chamber, a second container disposed in the first container for housing first particles or electronic parts, the first container having a circular inner shape in a cross section perpendicular to a longitudinal axis of the first container, and the second container having a polygonal inner shape in the cross section, first and second ring-shaped members respectively placed on first and second sides of the second container, a first ground shielding member for shielding a surface of the first and second containers other than a housing face for housing said first particles or said electronic parts, a rotation mechanism for causing the first and second containers to rotate or act as a pendulum on an axis of rotation perpendicular to the cross section so as to agitate or rotate said first particles or said electronic parts in the first and second containers, a grounding rod for striking against the first ground shielding member that is rotating or acting as the pendulum through the opening of the chamber in order to apply a vibration to said first particles or said electronic parts, an opposed electrode disposed in the first and second containers so as to face the housing face, a plasma power source electrically connected to the first and second containers, a gas introducing mechanism for introducing a raw gas into the first and second containers, an evacuation mechanism for evacuating an interior of the chamber, a first grounding plate, and a second grounding plate, wherein an outer circumference of each of the first and second ring-shaped members is connected to an inner surface of the first container, an inner circumference of each of the first and second ring-shaped members is placed on an inner surface of the second container at a side directly facing the opposed electrode, and the housing face is formed by side surfaces of the first and second ring-shaped members that face each other and the inner surface of the second container, and wherein a first surface of the first grounding plate is disposed between one end of the first and second containers and the opposed electrode, a second surface of the second grounding plate is disposed between the one end of the first and second containers and the opposed electrode, the first surface faces the second surface, an outer circumference of the first surface and an outer circumference of the second surface are covered with the first ground shielding member, and a gap between the first surface and the second surface is 5 mm or less.

2. The plasma CVD apparatus according to claim 1, further comprising a second ground shielding member for shielding a surface of the opposed electrode other than an opposed surface facing said first particles or said electronic parts housed in the second container, when the rotation mechanism causes the first and second containers to rotate or act as the pendulum.

3. The plasma CVD apparatus according to claim 2, further comprising a second plasma power source electrically connected to the opposed electrode.

4. The plasma CVD apparatus according to claim 1, wherein a minimum diameter or gap in a pathway through which a gas is evacuated from the interior of the chamber to an exterior of the chamber by the evacuation mechanism is 5 mm or less.

5. The plasma CVD apparatus according to claim 3, further comprising a magnetic substance particle housed in the first and second containers, wherein an electromagnet supplies electromagnetic power to the magnetic substance particle, and a pulse-controllable power source supplies current to the electromagnet in a pulse shape, and the magnetic substance particle is stirred by supplying electromagnetic power to the magnetic substance particle in a pulse shape.

6. The plasma CVD apparatus according to claim 5, wherein surfaces of the magnetic substance particle are coated with DLC particles or a DLC film.

7. The plasma CVD apparatus according to claim 1,
wherein the opposed electrode comprises a first surface and a second surface,
wherein the first surface is opposite to the second surface and faces the housing face, and
wherein the second surface is convex.

8. The plasma CVD apparatus according to claim 1, wherein the plasma power source is a high-frequency power source of 50 to 500 kHz.

9. The plasma CVD apparatus according to claim 1, wherein the surfaces of said first particles or said electronic parts are plasma CVD coated.

10. The plasma CVD apparatus according to claim 1, further comprising a ground shielding body disposed between the first ground shielding member and the chamber, and a second ground shielding member disposed between an end of the ground shielding body and the chamber, wherein the second ground shielding member is attached to an inner surface of the chamber, with a crevice of 3 mm or less from the end of the ground shielding body.

11. The plasma CVD apparatus according to claim 1, further comprising a ground shielding body disposed between the first ground shielding member and the chamber, wherein the ground shielding body is provided with an opening and the grounding rod strikes against the ground shielding member through the opening of the chamber and the opening of the ground shielding body in order to apply the vibration to said first particles or said electronic parts.

* * * * *